(12) United States Patent
Patti et al.

(10) Patent No.: US 11,063,027 B2
(45) Date of Patent: Jul. 13, 2021

(54) SEMICONDUCTOR DIE WITH IMPROVED THERMAL INSULATION BETWEEN A POWER PORTION AND A PERIPHERAL PORTION, METHOD OF MANUFACTURING, AND PACKAGE HOUSING THE DIE

(71) Applicant: STMICROELECTRONICS S.r.l., Agrate Brianza (IT)

(72) Inventors: Davide Giuseppe Patti, Mascalucia (IT); Mario Antonio Aleo, Catania (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 16/773,711

(22) Filed: Jan. 27, 2020

(65) Prior Publication Data

US 2020/0243496 A1 Jul. 30, 2020

(30) Foreign Application Priority Data

Jan. 28, 2019 (IT) .................... 102019000001201

(51) Int. Cl.
*H01L 23/00* (2006.01)
*H01L 25/16* (2006.01)
*H01L 21/762* (2006.01)
*H01L 21/763* (2006.01)
*H01L 25/00* (2006.01)

(52) U.S. Cl.
CPC ............ *H01L 25/16* (2013.01); *H01L 21/763* (2013.01); *H01L 21/76224* (2013.01); *H01L 25/50* (2013.01)

(58) Field of Classification Search
CPC .. H01L 25/16; H01L 21/76224; H01L 21/763
See application file for complete search history.

(56) References Cited

U.S. PATENT DOCUMENTS

| | | |
|---|---|---|
| 9,761,543 B1 | 9/2017 | Male et al. |
| 2004/0021198 A1 | 2/2004 | Wong |
| 2008/0006913 A1 | 1/2008 | Stecher |
| 2009/0279218 A1 | 11/2009 | Ferru |
| 2014/0048904 A1* | 2/2014 | Zundel ................ H01L 29/4236 257/499 |
| 2017/0256638 A1 | 9/2017 | MacElwee et al. |

\* cited by examiner

*Primary Examiner* — Errol V Fernandes
(74) *Attorney, Agent, or Firm* — Seed IP Law Group LLP

(57) ABSTRACT

A semiconductor die includes a structural body that has a power region and a peripheral region surrounding the power region. At least one power device is positioned in the power region. Trench-insulation means extend in the structural body starting from the front side towards the back side along a first direction, adapted to hinder conduction of heat from the power region towards the peripheral region along a second direction orthogonal to the first direction. The trench-insulation means have an extension, in the second direction, greater than the thickness of the structural body along the first direction.

20 Claims, 7 Drawing Sheets

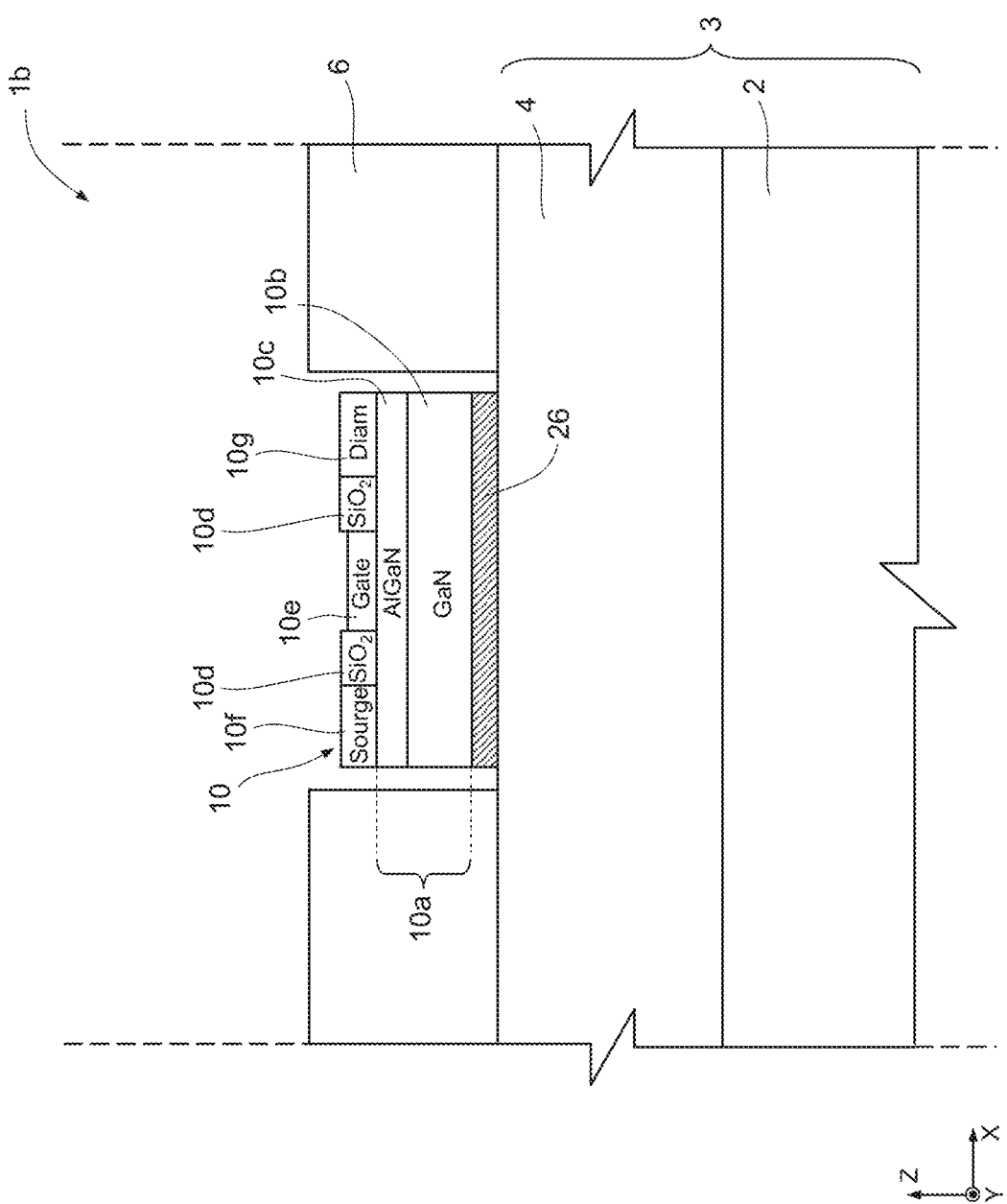

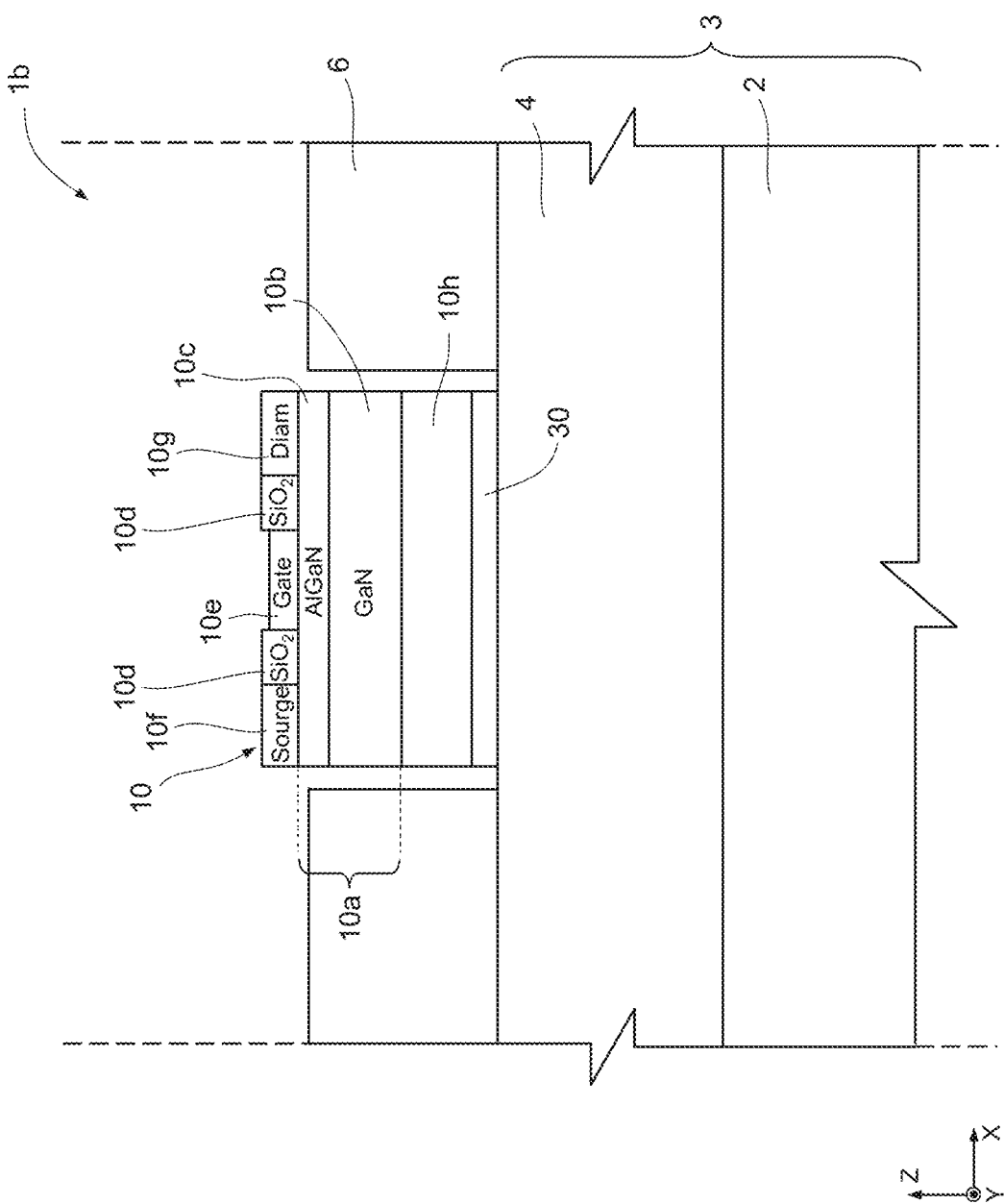

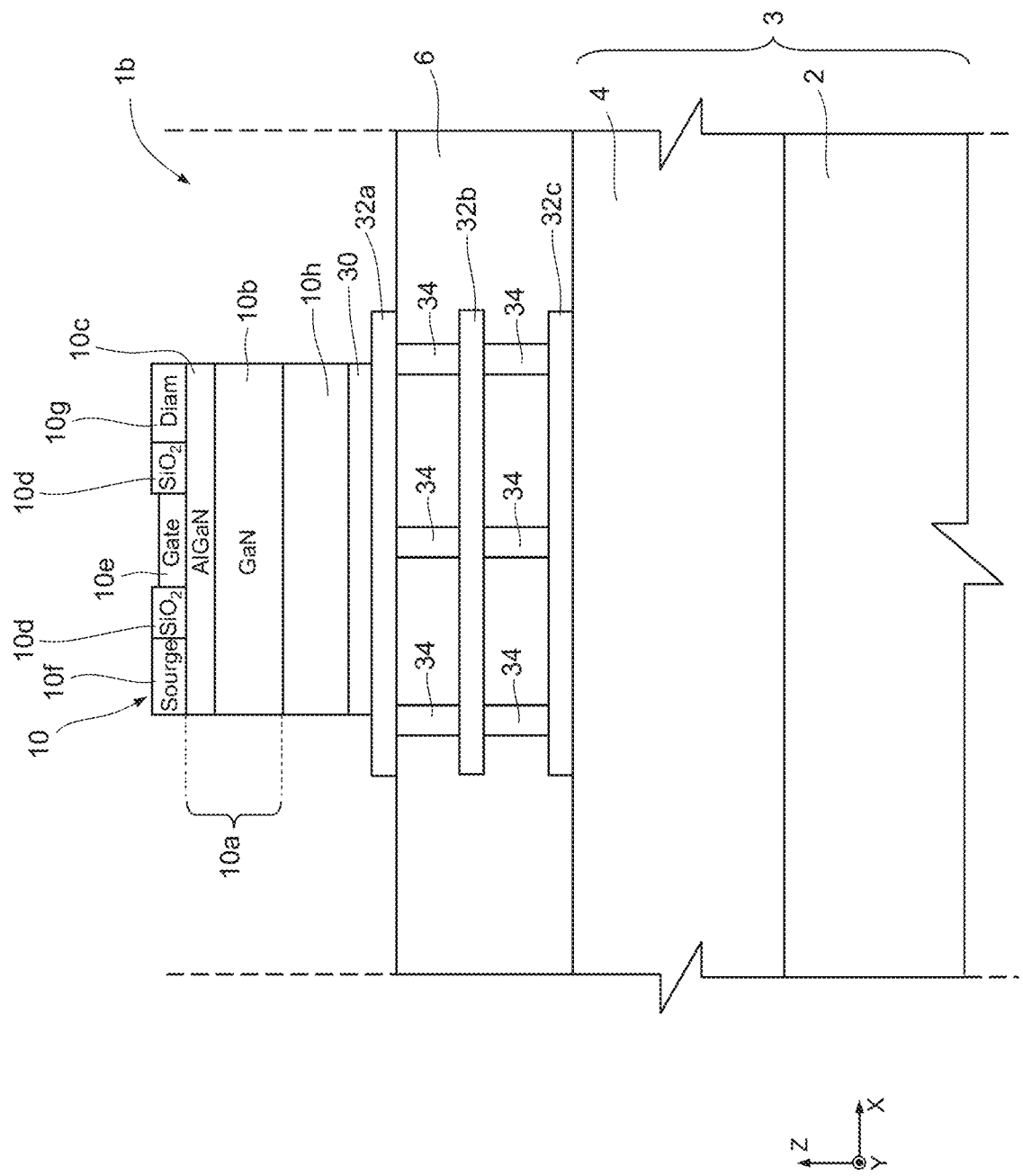

SEMICONDUCTOR DIE WITH IMPROVED THERMAL INSULATION BETWEEN A POWER PORTION AND A PERIPHERAL PORTION, METHOD OF MANUFACTURING, AND PACKAGE HOUSING THE DIE

BACKGROUND

Technical Field

The present disclosure relates to a semiconductor die, a method of manufacturing the semiconductor die, and a package housing the semiconductor die.

Description of the Related Art

GaN-based semiconductor devices are attracting considerable attention for power-electronics applications on account of their properties, such as the high breakdown electrical field, the high carrier density, the high electron mobility, and the high saturation rate. There are, on the other hand, known technologies for implementation of smart power integrated circuits (smart power ICs), based upon GaN-on-Silicon (GaN-on-Si) platforms having large dimensions, low cost, and high scalability.

Currently, high-voltage power components (e.g., power transistors, GaN-based HEMT (high electron mobility transistor) devices, etc.) are manufactured on, or bonded to, chips that house low-voltage peripheral devices and that form mixed digital/analog circuits. In particular, analog functional blocks, such as reference-voltage generators, voltage comparators, and voltage converters, have been obtained exploiting GaN-based technology in association with a peripheral circuitry obtained with CMOS silicon technology.

In the aforementioned technical solutions, the peripheral circuitry has, for example, the function of protection and/or control of the power components, and is necessary for guaranteeing a robust control, a greater functionality, and greater reliability of the high-voltage power components, for example, against harmful operating conditions, as in the case of over-currents and over-voltages.

It is highly desirable to integrate power devices in the same chip that houses the peripheral functional blocks, thus increasing the density of integration as far as possible.

However, the performance of the peripheral circuits, as likewise those of power devices, is dependent upon temperature. An excessively high temperature, generated by the power devices, may cause malfunctioning of the peripheral circuitry or, in extreme conditions, burning-out of the chip or of parts thereof.

Solutions for managing the temperature at a circuit level have been proposed, e.g., over temperature protection circuits; likewise, cooling solutions are known that envisage the use of heat dissipaters at the package level.

The above solutions, however, are not satisfactory when the density of integration increases and the distances between the electronic power devices and the peripheral circuitry are smaller.

BRIEF SUMMARY

The present disclosure provides a semiconductor die, a method of manufacturing the semiconductor die, and a package housing the semiconductor die that overcome the limitations of the prior art.

According to the present disclosure, a semiconductor die, a method of manufacturing the semiconductor die, and a package housing the semiconductor die are provided, as defined in the annexed claims.

BRIEF DESCRIPTION OF THE SEVERAL VIEWS OF THE DRAWINGS

For a better understanding of the present disclosure, some embodiments thereof is now described, purely by way of non-limiting example, with reference to the attached drawings, wherein:

FIGS. 5 to 7 illustrate variations of manufacturing of the power region of the die of FIG. 1 or FIG. 3, in accordance with some embodiments.

DETAILED DESCRIPTION

Figure 1:
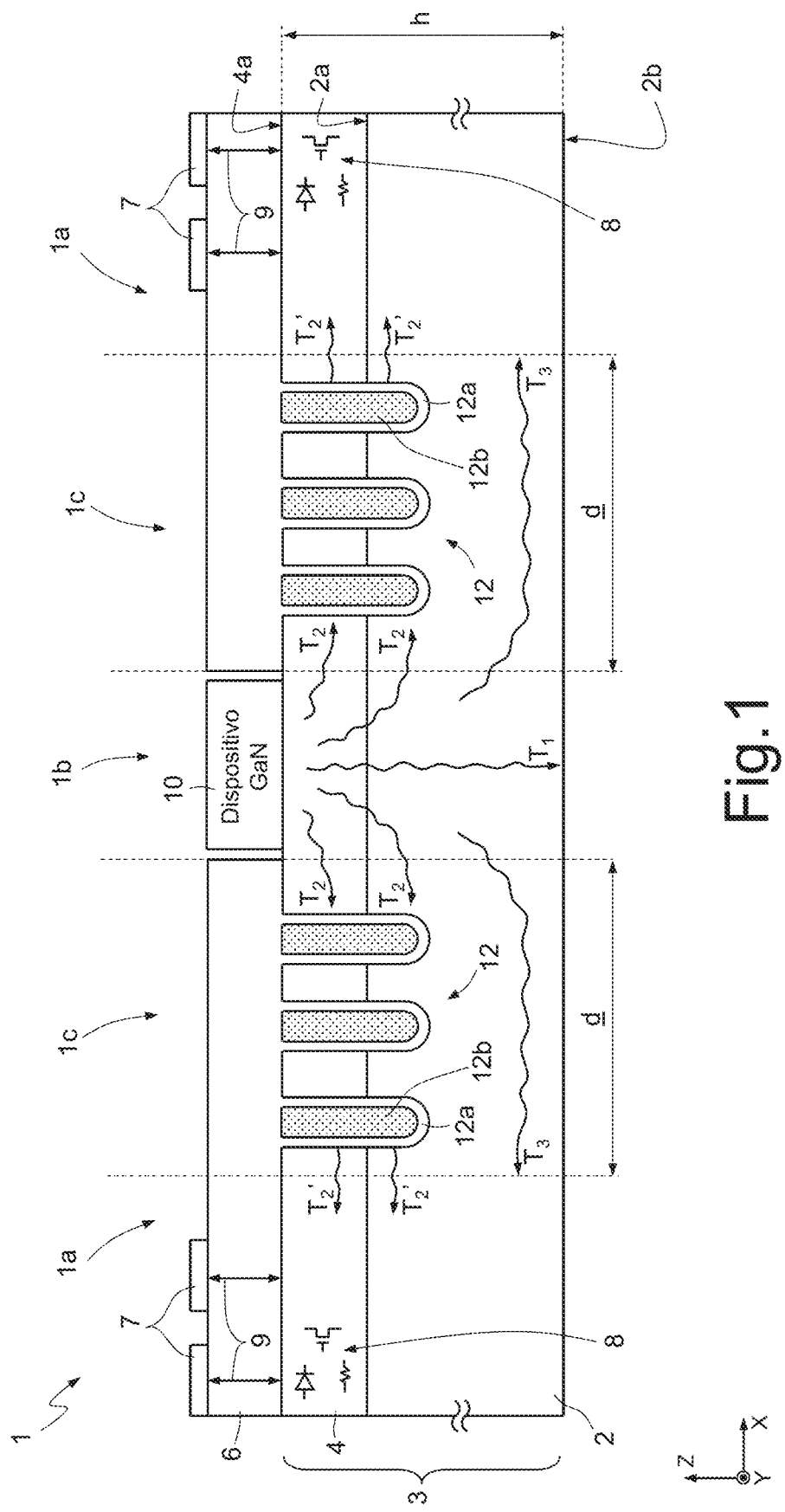
FIG. 1 is a cross-section view of a portion of a die provided with an electrical-insulation region between a power region and a peripheral region, taken along the line of section I-I of FIG. 2, according to some embodiments of the present invention.

FIG. 1 illustrates, in a side section view in a triaxial cartesian reference system X, Y, Z, a portion of a die 1 according to an aspect of the present disclosure. The elements illustrated in FIG. 1 are not represented in the same scale, but are represented schematically and by way of example, in order to facilitate understanding of the present disclosure.

The die 1 comprises: a substrate 2, made of a semiconductor material, for example, silicon, and for example, silicon with a P-type doping, having a front side 2a and a back side 2b, opposite to each other along the direction of the axis Z; an epitaxial layer 4, made of epitaxially grown silicon, for example, with a N-type doping, which extends over the front side 2a of the substrate 2; and a dielectric layer 6, made, for example, of silicon oxide ($SiO_2$), which extends over a top face 4a of the epitaxial layer 4.

It is appreciated that between the substrate 2 and the epitaxial layer 4, further epitaxial layers, or layers of some other type (not illustrated) may be present. In what follows, the ensemble of the substrate 2 and the epitaxial layer 4, including said possible further layers if present, will be referred to as "structural body 3", which has a thickness, considered along the axis X between the top face 4a of the epitaxial layer 4 and the back side 2b of the substrate 2, denoted by h. As will be more appreciated in the following description, the possible further layers present are of a thermally conductive material, indicatively, with a thermal conductivity comparable to, or higher than, that of the materials of the substrate 2 and/or of the epitaxial layer 4.

According to an aspect of the present disclosure, to enable a high density of integration, a planar process is used for the manufacturing of high-voltage power devices 10 and of low-voltage peripheral devices 8, e.g., obtained with CMOS technology, which implement functional blocks adapted to control/support operation of the power devices.

The layout of the die 1 may be organized so as to group together, in one and the same region of the die 1, the high-voltage power devices 10, and group together in one and the same respective region of the die 1 the low-voltage peripheral devices 8. In particular, the low-voltage peripheral devices 8 are formed in a region that surrounds, in top plan view (in the plane XY), the region that houses the high-voltage power devices 10.

Figure 2:
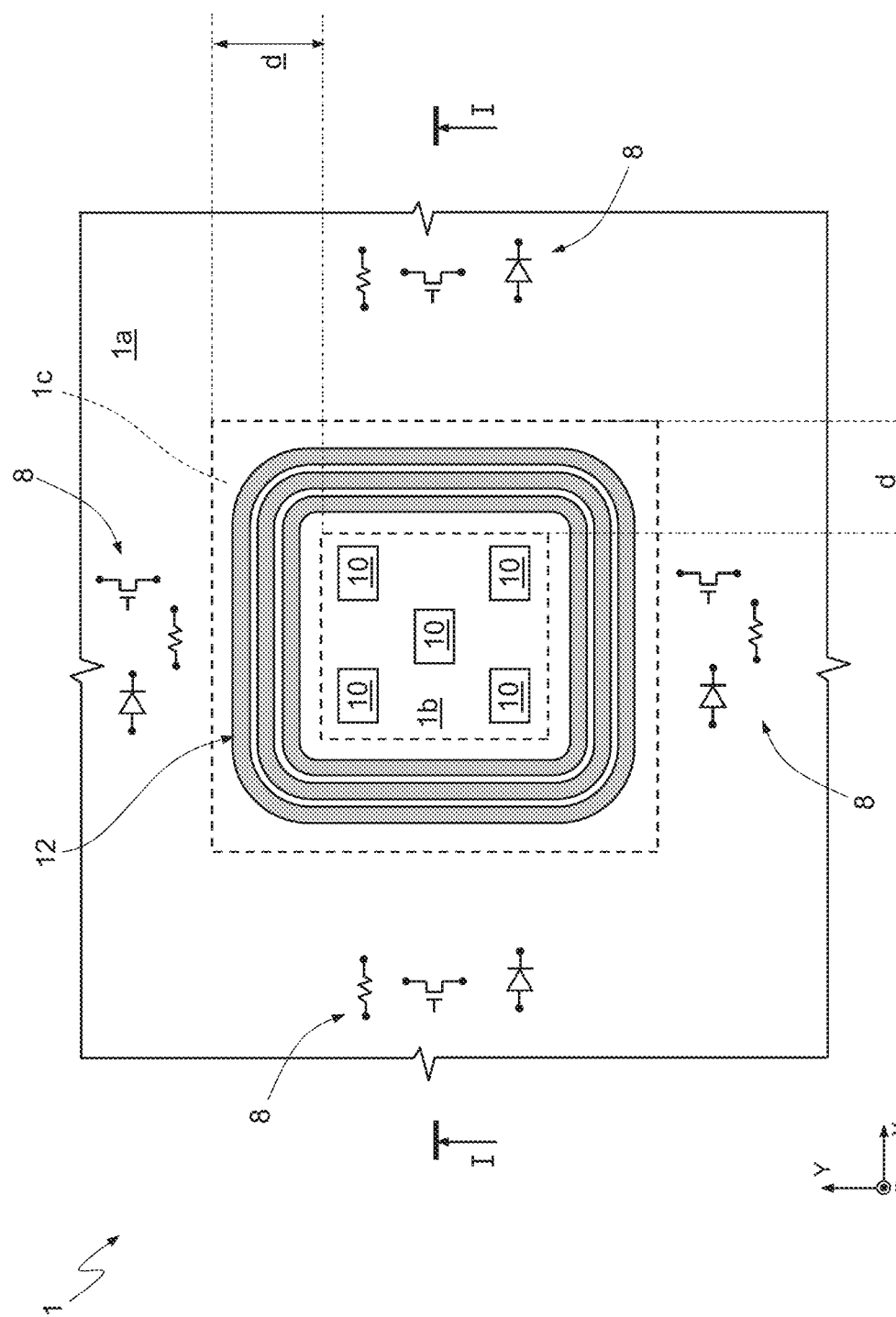
FIG. 2 is a top plan view of the die of FIG. 1.

For this purpose, with reference to FIGS. 1 and 2, the die 1, or specifically, the structural body 3, comprises a first region 1a that houses the low-voltage peripheral devices 8. In some embodiments, the low-voltage peripheral devices 8 are integrated in the structural body 3, and at least partly in the epitaxial layer 4. In what follows, the first region 1a will also be referred to as "peripheral region 1a", and the components housed therein will also be referred to as "peripheral components 8". Extending on the dielectric layer 6 are one or more electrical-contact pads 7, electrically coupled to the peripheral components 8 by means of conductive through vias and metal layers, generically designated by the reference number 9.

The die 1, or specifically, the structural body 3, further comprises a second region 1b that houses one or more high-voltage power devices 10, which include, for example, one or more GaN-based HEMTs. In general, the high-voltage power devices 10 dissipate, when the device is in operation, thermal energy of the order of hundreds of microjoules. In what follows, this second region 1b will also be referred to as "power region 1b", and the high-voltage power devices 10 will also be referred to as "power devices 10".

By way of example, the components/circuits of the peripheral region 1a and of the power region 1b form, together, a DC/DC converter, where the components/circuits of the peripheral region 1a form the control part, e.g., pre-amplification circuits, driving circuit for biasing the gate terminal or terminals, etc., of the DC/DC converter, whereas the power devices housed in the power region 1b form the switch elements of the DC/DC converter.

The die 1, or specifically, the structural body 3, further comprises a third region 1c, which extends, in top plan view (e.g., in the plane XY), between the first region 1a and the second region 1b, and houses one or more trenches 12 adapted to form an obstacle for lateral thermal propagation of the heat generated, when the device is in operation, by the power devices 10 in the power region 1b. As illustrated in the figure, the arrows T2, which represent the propagation of heat in the direction X, are intercepted and hindered by the trenches 12. In what follows, the third region 1c will also be referred to as "thermal-insulation region 1c".

FIG. 2 illustrates the die of FIG. 1 in top plan view, in the plane XY. In some embodiments, the section view of FIG. 1 is, in particular, taken along the line of section I-I of FIG. 2. As may be noted from FIG. 2, the thermal-insulation region 1c extends so as to completely surround the power region 1b. In turn, the peripheral region 1a extends so that it completely surrounds the thermal-insulation region 1c.

The function of the thermal-insulation region 1c is, as has been said, that of providing an obstacle for the propagation or transfer of the heat generated, when the device is in operation, in the power region 1b, towards the peripheral region 1a. It is appreciated that, in the case where the peripheral region 1a extends facing or adjacent to part of the power region 1b, e.g., the peripheral region 1 does not surround the power region 1b completely, the thermal-insulation region 1c can extend between the peripheral region 1a and the power region 1b, without surrounding the latter completely.

In any direction of thermal propagation considered (i.e., along X, along Y, or in directions that have a component both along X and along Y), the heat generated at the power region 1b is intercepted by the trenches 12 of the thermal-insulation region 1c.

Returning to FIG. 1, the one or more trenches 12 (here a plurality of trenches 12 are illustrated by way of example) include a first filling layer 12a of dielectric material (e.g., $SiO_2$) and a second filling layer 12b, completely contained within the first filling layer 12a. In some embodiments, the second filling layer 12b is made of a material adapted to compensate for the thermal stress that, when the device is in operation, is generated at the trenches 12. The present applicant has in fact noted that, on account of the different thermal expansions of the silicon oxide of the filling layer 12a with respect to the silicon of the structural body 3, the filling layer 12a may be subject to physical damage. Use of the second filling layer 12b, here for example polysilicon, enables this undesired phenomenon to be overcome.

It is, however, appreciated that, in the case where the structural body 3 and the first filling layer 12a are made of materials such that the undesired phenomenon mentioned above is not present, the second filling layer 12b may be omitted. Moreover, irrespectively of the materials used, the second filling layer 12b may be omitted also in the case where the specific operating application of the die 1 is such that no thermal stress is generated such as to cause damage to the trenches 12.

In general, the first filling layer 12a is made of a thermally insulating material, i.e., a material having a thermal conductivity approximately equal to 1 W/mK.

The trenches 12 extend in depth in the structural body 3, starting from the top face 4a of the epitaxial layer 4, completely through the epitaxial layer 4 and through part of the substrate 2, terminating within the substrate 2. These embodiments present the advantage of forming the trenches 12 simultaneously with trench regions for electrical insulation between devices/components in the peripheral region 1a. In fact, it is known to electrically insulate electronic components from one another, for example transistors, by means of trenches filled with dielectric material. During processing of the die 1, the step of forming such electrical-insulation trenches further comprises the simultaneous step of forming the thermal-insulation trenches 12. The manufacturing costs are thus reduced, and the production process is speeded up.

Alternatively or additionally, it is, however, possible to form the trenches 12 in a separate step. In this case, the depth of the trenches 12 is not constrained to the depth of the trenches present in the peripheral region 1a. In particular, the trenches 12 may extend through just the thickness of the epitaxial layer 4 or, in general, terminate at the front side 2a of the substrate 2.

Figure 3:
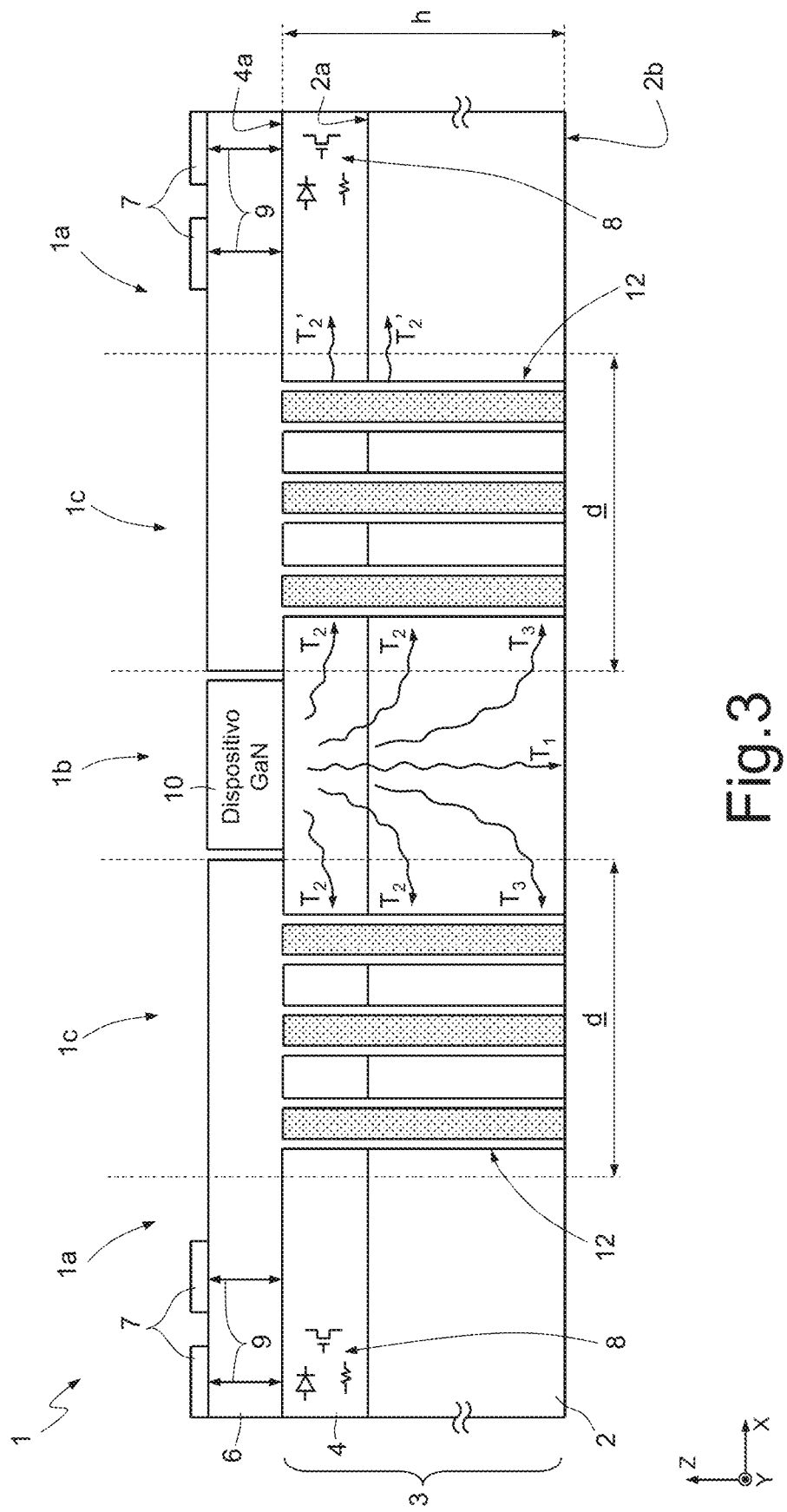
FIG. 3 is a cross-section view of a portion of a die provided with an electrical-insulation region between a power region and a peripheral region, according to some embodiments of the present disclosure.

According to some further embodiments, illustrated in FIG. 3, one or more of the trenches 12 (in FIG. 3, all of the trenches 12) may extend throughout the entire thickness of the structural body 3, i.e., completely through the epitaxial layer 4 and through the substrate 2 until reaching the back side 2b of the substrate 2.

The heat generated, in use, in the power region 1b propagates through the structural body 3. Among the various possible directions of propagation, the arrow T1 in FIG. 1 identifies a direction of vertical propagation, along the direction of the axis Z, towards the back side 2b of the substrate 2. Likewise identified in FIG. 1 is a first direction of lateral propagation, along the axis X, indicated by the arrow T2. This heat propagation in the direction T2 is hindered by the presence of the trenches 12. Furthermore, a second lateral direction of propagation, along the axis X, is indicated by the arrow T3, through the substrate 2 in the region of the latter without the trenches 12.

The thermal-insulation region 1c has a lateral extension d, along the direction of the axis X, such that the thermal path T3 will have a greater distance than the thermal path T1. To meet this requirement, in the design step, there is conservatively chosen a value of d greater than the value of h, where h is, as has been said, the thickness of the structural body 3. The lateral extension d is given, more in particular, by the sum of the extensions, along X, of each trench 12 plus the extension, once again along X, of the portion of the structural body 3 ranging between one trench 12 and the adjacent trench 12.

The number, the material and lateral extension of the trenches 12 are also chosen so that the trenches 12 will offer an adequate thermal insulation in regard to the thermal wave T2, e.g., such that the heat propagating through them along the direction of the axis X (arrows T2') as far as the peripheral region 1a, will be lower than a threshold pre-set in the design step.

The design of the trenches 12 (for example, in terms of number of trenches, materials, and thicknesses of the filling layers, lateral extension of the trenches, etc.) may be performed by means of simulation programs, in a way appreciated to the person skilled in the art.

It is clear that what has been described above with particular reference to the direction of thermal propagation along X (in particular, with reference to the lateral extension d of the thermal-insulation region 1c) applies to any direction of thermal propagation considered, i.e., along X, along Y, and in directions that have a component both along X and along Y.

The trenches 12 hence delimit a path, or channel, of preferential propagation of the heat that is generated in the power region 1b, which hence propagates preferentially towards the back side 2b of the substrate 2.

Figure 4:
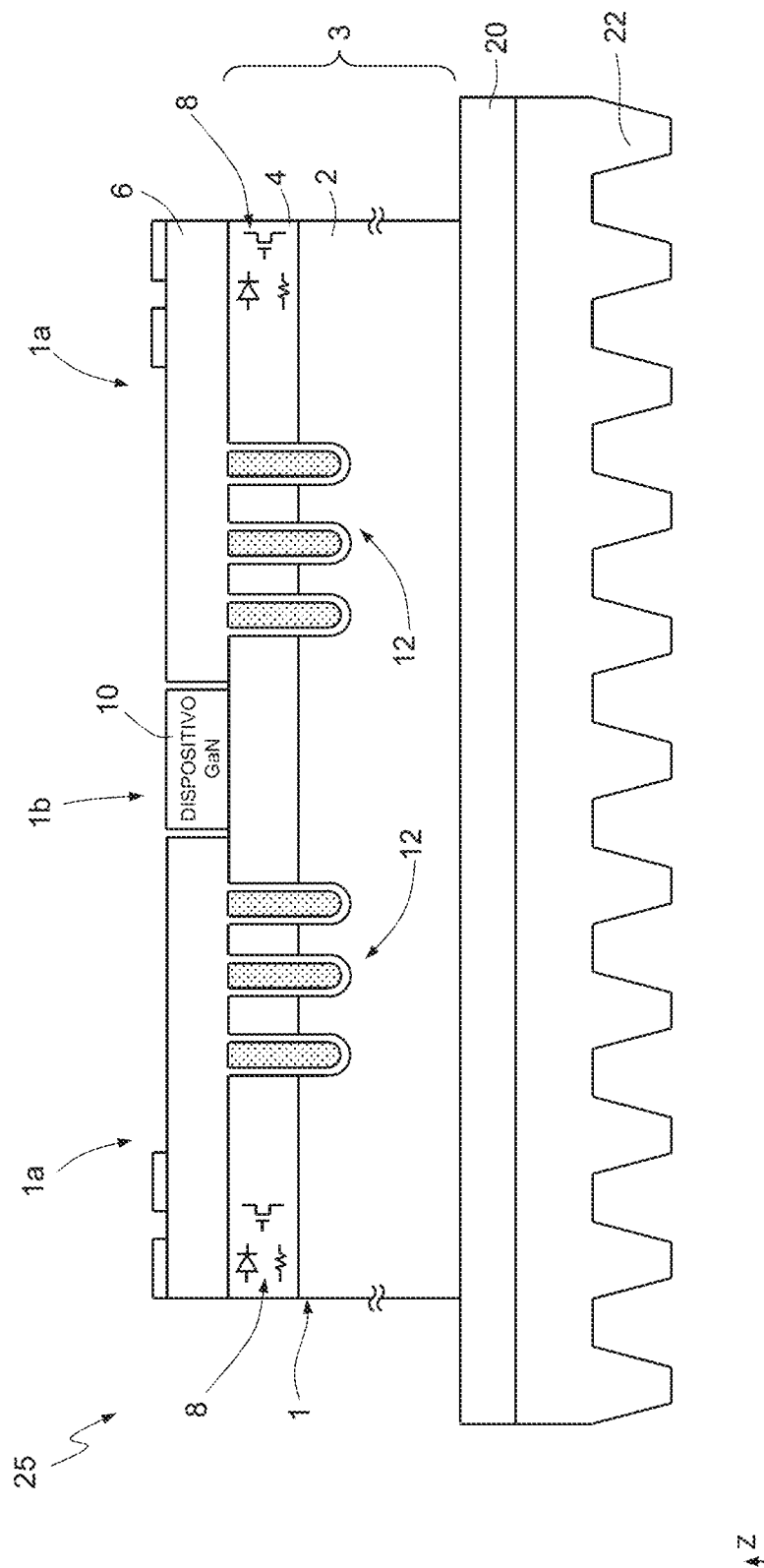
FIG. 4 illustrates a portion of a package housing the die of FIG. 1 or FIG. 3.

As illustrated schematically in FIG. 4, the die 1 is coupled, during packaging, to a base plate 20 made of thermally conductive material, in particular metal material such as copper, of a package 25 (only a portion of the package 25 is illustrated in FIG. 4). The base plate 20 of the package 25 is adapted to support the die 1 and is made of thermally conductive material to favor dissipation of the heat generated, in use, by the power devices 10. Typically, the base plate 20 is thermally coupled to a heat dissipater 22.

Hence, in use, the heat that propagates along T1, or that in general reaches the back side of the substrate 2, is transferred to the base plate 20 of the package 25 and then dissipated by means of the heat dissipater 22.

FIG. 5 illustrates an enlarged detail of the power region 1b of the die 1. In some embodiments, the power devices (here in particular only a GaN-based HEMT device 10 is illustrated) are formed on the structural body 3 in manufacturing steps that are simultaneous or subsequent to the manufacturing steps of the peripheral components 8. Manufacture of a GaN-based HEMT device is in itself known and not described herein in so far as it does not form the subject of the present disclosure. The device 10 includes a heterostructure 10a formed by a channel layer 10b, extending on which is a barrier layer 10c, made of aluminum and gallium nitride (AlGaN). An insulation layer 10d, made of dielectric material, extends on the barrier layer 10c. A gate terminal 10e extends on the barrier layer 10c between a source terminal 10f and a drain terminal 10g.

To favor adhesion of the channel layer 10b of the device 10 to the structural body 3 of the die 1 an interface layer 26 made of aluminum nitride is present. The interface layer 26 has the function of forming an interface for lattice adaptation between the crystal lattice of the epitaxial layer 4 (which is here made of silicon) and the crystal lattice of the channel layer 10b (which is here made of GaN), and likewise has the function of favoring thermal coupling between the HEMT device 10 and the underlying structural body 3.

The HEMT device 10 is of a lateral-conduction type, and has the source terminal 10f, the drain terminal 10g, and the gate terminal 10e on its top side, to favor their electrical contact (e.g., via wire bonding), for biasing of the device.

In some different embodiments, illustrated in FIG. 6 in the same enlarged view as that of FIG. 5, the one or more power devices 10 are coupled to the structural body 3 of the die 1 following upon manufacturing of the peripheral components 8 (in FIG. 6 just one single GaN-based HEMT device 10 is once again illustrated).

In this case, the HEMT device 10 has a substrate 10h, made, for example, of Si or SiC, on which the heterostructure 10a extends. A thermally conductive coupling region 30, for example made of thermally conductive glue or solder paste, which extends between the substrate 10h of the HEMT device 10 and the structural body 3, coupling them together.

According to some further embodiments, illustrated in FIG. 7, the dielectric layer 6 houses a plurality of metal layers 32a-32c, which form as a whole a metal stack. FIG. 7 illustrates, by way of example, a bottom layer 32c, a top layer 32a, and an intermediate layer 32b, arranged between the bottom layer 32c and the top layer 32a. The metal layers 32a-32c are coupled together by means of thermally conductive through vias 34. The bottom metal layer 32c is in thermal contact with the structural body 3 (possibly via an interface layer), whereas the top metal layer 32a is in thermal contact with the substrate 10h of the device 10, via the coupling region 30 (here for instance, made of solder paste, for example lead or tin). The metal layers 32a-32c further improve thermal coupling between the HEMT device 10 and the structural body 3. Other coupling or bonding techniques between the HEMT device 10 and the structural body 3 may be used, as is appreciated to the person skilled in the art.

From an examination of the characteristics of the present disclosure provided according to the present disclosure, the advantages that it affords are appreciated.

In particular, the present disclosure enables thermal decoupling of the low-power (CMOS) circuitry from the high-power circuitry. It is thus possible to increase the density of integration of the components on a single die without incurring malfunctioning due to the high level of heat generated, in use, by the power devices.

Finally, it is clear that modifications and variations may be made to the disclosure described and illustrated herein, without thereby departing from the scope thereof, as defined in the annexed claims.

For instance, the power devices housed in the power region 1b include one or more of the following: lateral (LDMOSs), BJTs, power MOSs (for example, bases on SiC), IGBTs, etc.

Moreover, the components/circuits of the peripheral region 1a and of the power region 1b may form, together, an AC/AC cycloconverter, a DC/AC inverter, and an AC/DC rectifier.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor structure comprising:
    a structural body made of semiconductor material and having a first side and a second side, the first side of the structural body including a first region and a second region, the second region at least partially surrounding the first region;
    at least one low-voltage semiconductor device arranged in the second region;
    at least one semiconductor power device arranged in the first region;
    a thermally conductive coupling interface that couples between the at least one semiconductor power device and the structural body; and
    a third region positioned between the first region and the second region, the third region including a trench-insulation structure extending in the structural body starting from the first side towards the second side along a first direction, the trench-insulation structure having a dimension and a material such as to form an obstacle to heat conduction from the first region towards the second region along a second direction substantially orthogonal to the first direction.

2. The semiconductor structure according to claim 1, wherein the third region has an extension in the second direction greater than a thickness of the structural body measured along the first direction from the first side to the second side.

3. The semiconductor structure according to claim 2, wherein the trench-insulation structure includes:
    a plurality of trenches in succession with one another along the second direction and spaced apart from one another, along the second direction, by separation regions, the extension of the third region in the second direction including a sum of extensions of the trenches and extensions of the separation regions in the second direction; or
    a single trench, the extension of the third region being an extension, along the second direction, of the single trench.

4. The semiconductor structure according to claim 3, wherein each trench of the plurality of trenches or the single trench includes a thermally insulating material.

5. The semiconductor structure according to claim 3, wherein each trench of the plurality of trenches, or the single trench, includes a layer of dielectric material and a polysilicon region, each layer of dielectric material completely surrounding the polysilicon region.

6. The semiconductor structure according to claim 1, wherein the trench-insulation structure extends, along the first direction, through the entire structural body as far as the second side.

7. The semiconductor structure according to claim 1, wherein the trench-insulation structure extends, along the first direction through a part of a thickness of the structural body in the first direction, and terminating inside the structural body.

8. The semiconductor structure according to claim 7, wherein the structural body includes a substrate of P-type silicon, and an epitaxial layer of N-type silicon over the substrate, the trench-insulation structure extending completely through the epitaxial layer, and terminating inside the substrate.

9. The semiconductor structure according to claim 1, wherein the thermally conductive coupling interface includes one or more of a layer of aluminum nitride, thermally conductive glue, solder paste, or a metal stack.

10. The semiconductor structure according to claim 1, wherein the at least one low-voltage semiconductor device in the second region includes a plurality of electronic components manufactured with a CMOS technology.

11. The semiconductor structure according to claim 1, wherein the at least one semiconductor power device is a GaN-based high electron mobility transistor (HEMT) device.

12. The semiconductor structure according to claim 1, wherein the trench-insulation structure completely surrounds, in the second direction, the first region, and forms a ring-like thermal-insulation structure.

13. A package, comprising:
    a base plate, made of thermally conductive material; and
    a semiconductor die coupled to the base plate, the semiconductor die including:
        a structural body made of semiconductor material having a first side and a second side, the second side being coupled to the base plate, the structural body including a first region and a second region, the second region at least partially surrounding the first region;
        at least one low-voltage semiconductor device arranged in the second region at the first side of the structural body;
        at least one semiconductor power device arranged in the first region at the first side of the structural body;
        a thermally conductive coupling interface that couples between the at least one semiconductor device and the structural body; and
        a third region positioned between the first region and the second region, the third region including a trench-insulation structure extending in the structural body starting from the first side towards the second side along a first direction, the trench-insulation structure having a dimension and a material such as to form an obstacle to heat conduction from the first region towards the second region along a second direction substantially orthogonal to the first direction.

14. The package according to claim 13, wherein the at least one semiconductor power device is a GaN-based high electron mobility transistor (HEMT) device and the at least one low-voltage semiconductor device is a CMOS device.

15. A semiconductor structure comprising:
    a structural body of a semiconductor material having a first surface and a second surface, the first surface including a first region and a second region at least partially surrounding the first region;
    a base plate coupled to the second surface of the structural body;
    at least one semiconductor power device coupled to the first surface of the structural body in the first region via a thermally conductive coupling interface; and
    a trench-insulation structure between the first region and the second region on the first surface of the structural body, the trench-insulation structure extending along a first direction starting from the first surface towards the second surface, the trench-insulation structure having a dimension and a material chosen so as to form an obstacle to a conduction of heat from the first region towards the second region along a second direction substantially orthogonal to the first direction.

16. The semiconductor structure according to claim 15, wherein the trench-insulation structure includes an extension, along the second direction, greater than a thickness of the structural body measured along the first direction from the first surface to the second surface.

17. The semiconductor structure according to claim 15, wherein the thermally conductive coupling interface includes one or more of thermally conductive glue or solder paste.

18. The semiconductor structure according to claim 16, wherein the trench-insulation structure includes a plurality of mutually successive trenches along the second direction spaced apart from one another by respective separation regions, an extension of the trench-insulation structure being a sum of extensions of the plurality of mutually successive trenches and of the separation regions along the second direction.

19. The semiconductor structure according to claim 16, wherein the trench-insulation structure includes a single trench, the extension of the trench-insulation structure being an extension, along the second direction, of the single trench.

20. The semiconductor structure according to claim 15, wherein the trench-insulation structure includes a recess and a thermally insulating material in the recess.

* * * * *